(12) United States Patent
Kannengiesser et al.

(10) Patent No.: US 7,265,546 B2
(45) Date of Patent: Sep. 4, 2007

(54) METHOD AND MR APPARATUS FOR PPA MR IMAGING WITH RADIAL DATA ACQUISITION

(75) Inventors: Stephan Kannengiesser, Erlangen (DE); Thomas Mertelmeier, Erlangen (DE); Arnulf Oppelt, Spardorf (DE)

(73) Assignee: Siemens Aktiengesellschaft, Munich (DE)

( * ) Notice: Subject to any disclaimer, the term of this patent is extended or adjusted under 35 U.S.C. 154(b) by 168 days.

(21) Appl. No.: 11/119,478

(22) Filed: Apr. 29, 2005

(65) Prior Publication Data

US 2005/0251023 A1   Nov. 10, 2005

(30) Foreign Application Priority Data

Apr. 30, 2004   (DE) ..................... 10 2004 021 772

(51) Int. Cl.
*G01V 3/00* (2006.01)
(52) U.S. Cl. ....................... 324/309; 324/307
(58) Field of Classification Search ............... 324/307, 324/309
See application file for complete search history.

(56) References Cited

U.S. PATENT DOCUMENTS 6,487,435 B2* 11/2002 Mistretta et al. ............ 600/420
6,710,686 B2* 3/2004 Mertelmeier et al. ....... 324/314
6,801,597 B2* 10/2004 Webber ....................... 378/62
6,954,067 B2* 10/2005 Mistretta .................... 324/307
2005/0073303 A1* 4/2005 Harer et al. ................. 324/307

OTHER PUBLICATIONS

"An Algorithm for Numerical Calculation of the K-space Data-Weighting for Polarly Sampled Trajectories: Application to Spiral Imaging," Papadakis et al., Magnetic Resonance Imaging, vol. 15, No. 7 (1997) pp. 785-794.
"Chemical-Shift Imaging Utilizing the Positional Shifts Along the Readout Gradient Direction," Altbach et al., IEEE Trans. on Medical Imaging, vol. 20, No. 11, Nov. 2001, pp. 1156-1166.

* cited by examiner

*Primary Examiner*—Brij Shrivastav
*Assistant Examiner*—Dixomara Vargas
(74) *Attorney, Agent, or Firm*—Schiff Hardin LLP

(57) ABSTRACT

In a method and for MR apparatus PPA imaging with radial data acquisition in magnetic resonance tomography, k-space is under-scanned by acquiring a number of projections $\phi$ with a coil array of M component coils, a shift operator $C(\pm n\Delta k)$ is determined for a projection $\phi i$ on the basis of measured magnetizations along a projection $\phi i \pm \alpha 0$ that encompasses with $\phi i$ an angle $\alpha 0$, with $n=1, 2, \ldots, M-1$, the shift operator $C(\pm n\Delta k)$ is applied to individual points of projection $\phi i$ in order to obtain calculated projection points, the determination and the application of the shift operator $C(\pm n\Delta k)$ are repeated for all projections $\phi$, and an image is reconstructed in the spatial domain on the basis of the projections, which have been completed purely computationally.

24 Claims, 4 Drawing Sheets

METHOD AND MR APPARATUS FOR PPA MR IMAGING WITH RADIAL DATA ACQUISITION

BACKGROUND OF THE INVENTION

1. Field of the Invention

The present invention relates generally to magnetic resonance tomography, (MRT) as is used in the field of medicine for the examination of patients. The present invention relates in particular to a method, and to an MRT apparatus for implementing such a method, wherein partial parallel acquisition (PPA) is used for projection reconstructions, i.e., with radial data acquisition.

2. Description of the Prior Art

MRT is based on the physical phenomenon of nuclear spin resonance, and has been used successfully for more than 20 years as an imaging method in medicine and in biophysics. In this examination modality, the subject is exposed to a strong, constant magnetic field. This causes the nuclear spins of the atoms in the subject, which were previously oriented randomly, to become aligned. Radio-frequency energy can now excite these "ordered" nuclear spins to a particular oscillation. This oscillation produces the actual measurement signal in MRT, which is acquired by suitable reception coils. Through the use of non-homogenous magnetic fields, produced by gradient coils, the measurement subject can be spatially coded in all three spatial directions. The method allows a free choice of the volume to be imaged, so tomograms of the human body can be recorded in all directions. As a tomography modality in medical diagnostics, MRT is primarily distinguished, as a non-invasive examination method, by a versatile capacity for contrast. Due to its excellent representation of soft tissue, MRT has developed into a method that is in many ways superior to x-ray computed tomography (CT). Today, MRT is based on the use of spin echo and gradient echo sequences that enable excellent image quality with measurement times on the order of magnitude of minutes.

Constant further technological development of the components of MRT devices, and the introduction of rapid imaging sequences, has continued to open new areas of use for MRT in the field of medicine. Real-time imaging for the support of minimally invasive surgery, functional imaging in neurology, and perfusion measurement in cardiology are only a few examples. Despite the technical progress in the design of MRT devices, the exposure time for an MRT image remains the limiting factor for many MRT applications in the area of medical diagnostics. A limit is placed on any further increase in the efficiency of MRT devices with respect to the exposure time from the technical point of view (feasibility) and for the protection of the patient (stimulation and heating of tissue). In recent years, many efforts have therefore been made to find new approaches to further reduce the image measurement time.

One approach to shortening the acquisition time is to reduce the number of measurement steps. In order to obtain a complete image from such a data set, either the missing data must be reconstructed using suitable algorithms or the erroneous image must be corrected from the reduced data.

Data acquisition in MRT takes place in k-space (frequency domain). The MRT image in the image domain is linked to the MRT data in k-space by means of Fourier transformation. The spatial coding of the subject, which spans k-space, can take place in various ways; however, the most common is a Cartesian scanning or a scanning by projections. The coding takes place by means of gradients in all three spatial directions. In Cartesian scanning, a distinction is made between slice selection (defines an exposure slice in the subject, e.g. the z-axis), frequency coding (defines a direction in the slice, e.g. the x-axis), and phase coding (determines the second dimension inside the slice, e.g. the y-axis).

In an acquisition method for projection reconstruction, a gradient is used that is not successively increased for scanning line-by-line in the Cartesian format, but instead is rotated around the sample. In this way, in each measurement step a projection is obtained from a particular direction through the entire sample, and thus a typical data set is obtained for the projection reconstruction in the k-space, as is shown in FIG. 3. The totality of the points, corresponding to the acquired data in k-space, is hereinafter referred to as the projection data set.

In contrast to Cartesian scanning, radial (or spiral) scanning of the frequency domain is advantageous particularly in the imaging of moving objects such as a beating heart, because motion artifacts in the image reconstruction are smeared over the entire image field, and thus are not noticeable. In contrast, in Cartesian scanning of the frequency domain, in the reconstructed image phantom images occur that are usually disturbing and that are expressed as image structures that repeat periodically in the phase coding direction. However, a disadvantage of radial scanning of the frequency domain is the longer measurement time required in comparison with Cartesian scanning for a nominally equal spatial resolution. In Cartesian scanning, the number of phase coding steps $N_y$ determines the measurement time, while in radial scanning this is determined by the number of angular steps $N_\varphi$. For identical spatial resolution, $N_\varphi = (\pi/2) N_y$.

Most methods for shortening the image measurement time in Cartesian scanning are based on a reduction of the plurality of time-consuming phase coding steps $N_y$ and the use of a plurality of signal reception coils; called partial parallel acquisition, or PPA. This principle can be carried over to data acquisition methods using radial scanning, by reducing the number of time-consuming angular steps $N_\varphi$.

The basis for PPA imaging is that the k-space data are acquired not by an individual coil, but rather by component coils disposed around the subject in linear, annular, or matrix-type fashion, for example in the form of a coil array. As a result of their geometry, each of the spatially independent components of the coil array supplies certain spatial information that is used to achieve a complete spatial coding by combining the simultaneously acquired coil data. This means that for radial k-space scanning, a number of "omitted" projections in k-space can be determined from a single acquired k-space projection.

Thus, PPA methods use spatial information contained in the components of a coil array in order to partially replace the time-consuming additional switching of the rotating gradients. In this way, the image measurement time is reduced corresponding to the ratio of the number of projections of the reduced projection data set to the number of lines of the conventional (i.e. complete) data set. In a typical PPA acquisition, in comparison to conventional acquisition, only a fraction (one-half, one-third, one-fourth, etc.) of the projections are acquired. A specific reconstruction is then applied to the projection data in order to reconstruct the missing projections, and thus to obtain the complete field of view (FOV) image in a fraction of the time. The FOV is defined by the size of k-space under consideration, according to the factor $2\pi/k$.

A method for using parallel data acquisition with radial scanning of the frequency space is described, for example, in U.S. Pat. No. 6,710,686, by reconstructing partial images for each coil from a reduced number of projections that are superposed in a locally precise manner.

This known method is based on the Fourier shift theorem, which assigns, to a shift of a point having polar coordinates k, φ in the frequency space by the vector $\Delta \bar{k}$ a multiplication of the core magnetization in the spatial domain with the harmonic $e^{j\Theta}$, the phase being given by $\Theta=\Delta \bar{k} \bar{r}$. In the case of magnetic resonance tomography, k means the time sum of the magnetic field gradients applied to the examination subject during the reading out of the nuclear resonance signal. Additional coordinates, quantities, and abbreviations used in the following are illustrated on the basis of FIG. 2:

x, y: Cartesian locus coordinates r, α: polar locus coordinates $$r = \sqrt{x^2 + y^2}$$

tgα=y/x;

k=∫Gdtφ: time sum of the readout gradient

φ: direction of the readout gradient $\Delta\Phi=\phi_{i+1}-\phi_i$

ψ=φ−α

Established PPA methods for Cartesian data acquisition, such as SMASH or GRAPPA, already make use of the Fourier shift theorem, by impressing an additional phase $\Delta k_y$, y onto the magnetic resonance signal along the phase coding direction through combination of the individual coil signals. In this way, new $k_y$ lines arise in the frequency domain that no longer need be measured explicitly, thus reducing the measurement time.

For radial scanning of the frequency domain, the frequency domain must be occupied with radii having length K=π/ΔR, rotated by the angular step $\Delta\Phi=\phi_{i+1}-\phi_i=\pi/KR$, so that sufficient data are present for a complete image reconstruction. ΔR represents the locus resolution desired in the image; R is the radius of the desired image field. However, if M signal recording coils are available, in the known method up to M−1 additional angular intermediate steps $\Delta\phi_n$ (n=1, 2, . . . M−1) can be generated without measurement, so that the angular step to be measured can be increased to the value $$\Delta\Phi = M\frac{\pi}{KR},$$

and the measurement time can be correspondingly reduced.

For the individual coil m (1<m≦M), the coil signal in polar coordinates is given by $$F_m(k, \varphi) = \int_{-Y}^{Y}\int_{-X}^{X} S_m(x, y)M(x, y)e^{ikr\cos\varphi\cos\alpha}e^{ikr\sin\varphi\sin\alpha}\,dx\,dy \quad (1)$$

$$= \int_0^\pi \int_{-R}^R S_m(r, \alpha)M(r, \alpha)e^{ikr\cos(\varphi-\alpha)}r\,dr\,d\alpha$$

$1 < m \leq M$, $S_m$(x, y): sensitivity profile of coil m in Cartesian coordinates $S_m$(r, a): sensitivity profile of coil m in polar coordinates M (x, y): cross-magnetization The overall magnetization at the point k, φ in the frequency space results as the superposition of the individual coil values.

$$G_O(k, \varphi) = \sum_{m=1}^{M} F_M(k, \varphi) \quad (2a)$$

If weighted sum profiles are now produced from the sensitivity profiles of the coils such that there arise harmonics $$\sum_{m=1}^{M} C_{nm} S_m(r, \alpha) \approx e^{i\Theta_n}, 0 \leq n \leq M-1 \quad (3)$$

having the argument $\Theta_n=kr(\cos(\psi-n\Delta\phi)-\cos\psi)$, (4a)

which for nΔφ<<1 reduces to $\Theta_n=kr\sin\Psi n\Delta\phi$, (4b)

then from the coil signals up to M−1, new magnetizations can be calculated in the frequency space at the points k, φ+nΔφ.

$$G_n(k, \varphi + n\Delta\varphi) = F_m(k, \varphi) \quad (5)$$

$$= \sum_{m=1}^{M} C_{nm}\int_0^\pi \int_{-R}^R S_m(r, \alpha)M(r, \alpha)$$

$$e^{ikr\cos(\varphi-\alpha)}r\,dr\,d\alpha$$

$$= \int_0^\pi \int_{-R}^R e^{i\Theta_n}M(r, \alpha)e^{ikr\cos(\varphi-\alpha)}r\,dr\,d\alpha$$

$$= \int_0^\pi \int_{-R}^R M(r, \alpha)e^{ikr\cos(\varphi+n\Delta\varphi-\alpha)}r\,dr\,d\alpha$$

The newly calculated points result from the shifting of a respective measured point in the frequency space (FIG. 2).

A disadvantage of this method is that in order to be able to indicate this coefficient C, the precise knowledge of the coil profile $S_m$ is required. Conventionally, this has been explicitly obtained with additional measurement steps, and, generally using a calibration measurement carried out before the actual imaging or integrated into the actual measurement sequence, requiring a significant additional measurement expense.

SUMMARY OF THE INVENTION

An object of the present invention is to provide a method in which additional calibration measurements for the precise acquisition of the coil sensitivities can be omitted, in order to shorten the overall measurement time of a parallel acquisition method for projection reconstructions.

This object is achieved according to the present invention by a method for improved PPA imaging with radial data acquisition in magnetic resonance tomography, wherein under-scanning of k-space takes place by acquiring a number of projections φ with a coil array of M component coils, determining a shift operator C (±nΔk) for a projection $\phi_i$ on the basis of measured magnetizations along a projection $\phi_i \pm \alpha_0$ that encompasses with $\phi_i$ an angle $\alpha_0$, with n=1, 2, ..., M−1, applying the shift operator C (±nΔk) to individual points of projection $\phi_i$ in order to obtain calculated projection points, repeating the determination and the application of the shift operator C (±nΔk) for all projections φ, and reconstructing of an image in the spatial domain on the basis of the projections, which have been completed purely computationally in this manner.

The angle, $\alpha_0$ preferably has a value of 90°.

According to the present invention, the shift operators C(±nΔk) are determined by solving over-determined equation systems of $\overline{G},F$ and C, or $\Delta F, F$ and C, with the pseudo-inverses $F'(FF')^{-1}$, where $\overline{G}$ represents in each case the vector of shifted combined measured coil signals, F represents in each case the vector of measured coil signals, and ΔF represents a vector of shifted measured coil signals.

Advantageously, for more precise determination of C (±nΔk), values of the projections $\phi_{i \pm a} \pm \alpha_0$, adjacent to each $\phi_i \pm \alpha_0$, are taken into account, whereby a=1, 2, ..., depending on the degree of precision.

With the present invention, a complete raw data set in the k-space thus is obtained by calculating projections shifted in various directions by ±nΔk, on the basis of the determined shift operators C (±nΔk) and the measured projections.

In an embodiment of the method according to the invention, the totality of the calculated shifted projections are used for the reconstruction of the image.

In contrast, in a further embodiment of the method according to the invention, for the reconstruction of the image only the parts of the calculated shifted projections are used that lie on radial lines in k-space.

For a linear arrangement of the coil array, it is advantageous to select the angular scanning density in the longitudinal direction of the coil array to be greater than in the orthogonal direction.

The invention also encompasses a magnetic resonance tomography apparatus that is suitable for implanting the inventive method. The invention also encompasses a computer software product that implements the inventive method when run on a computing device of a magnetic resonance tomography apparatus.

DESCRIPTION OF THE PREFERRED EMBODIMENTS

Figure 1:
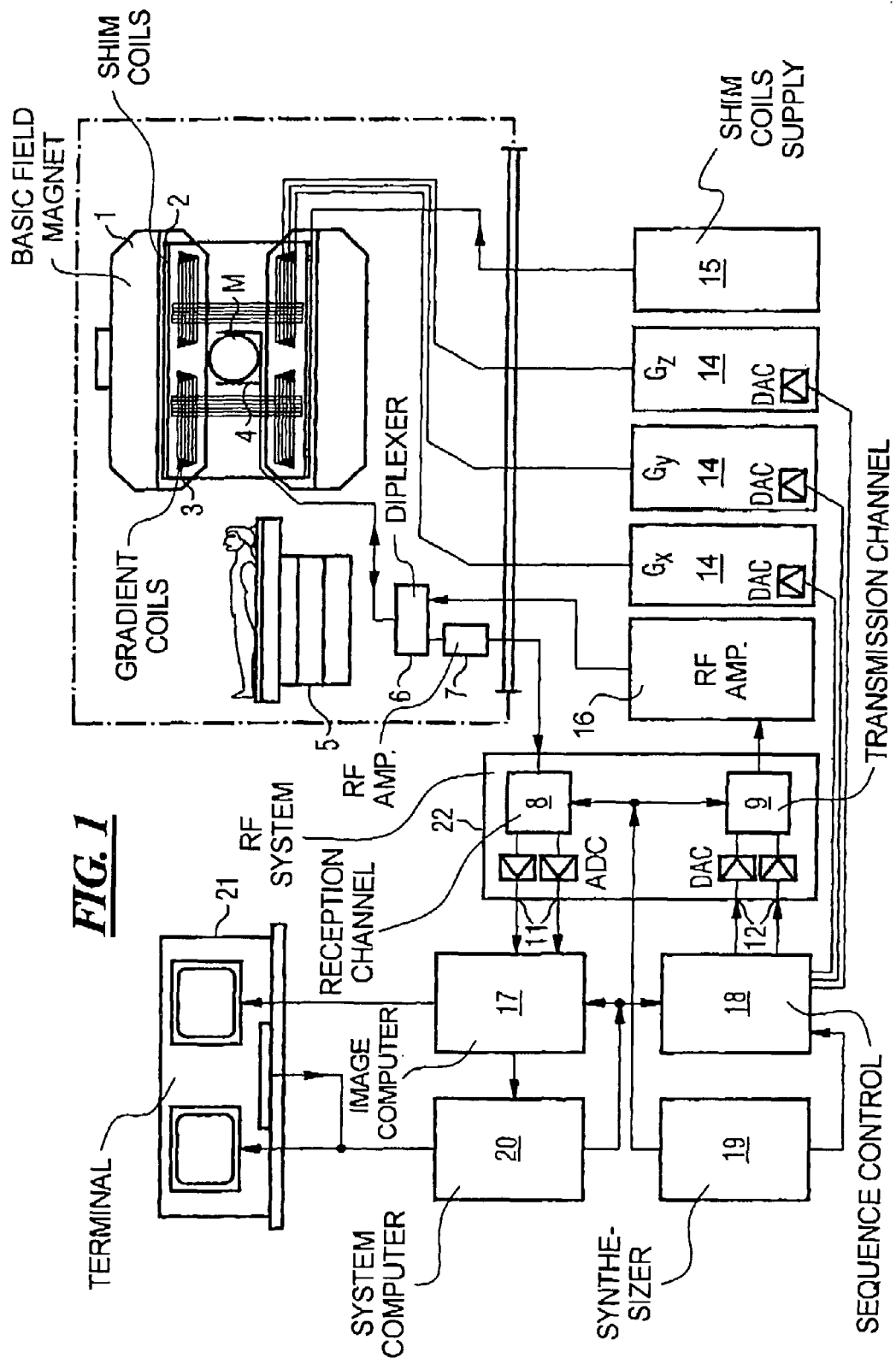
FIG. 1 is a block diagram of a magnetic resonance tomography apparatus according to the present invention.
Figure 2:
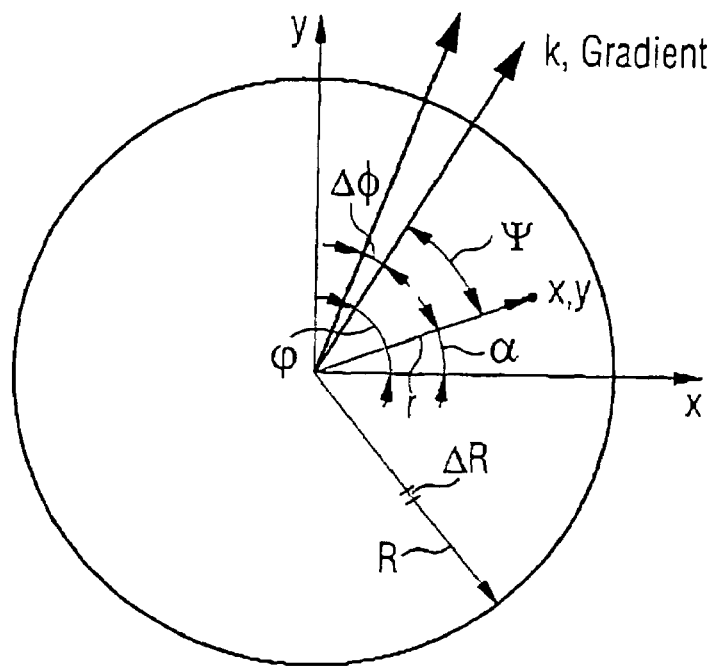
FIG. 2 illustrates the terminology used in the description of the quantities in the coordinate system of the spatial domain.
Figure 3:
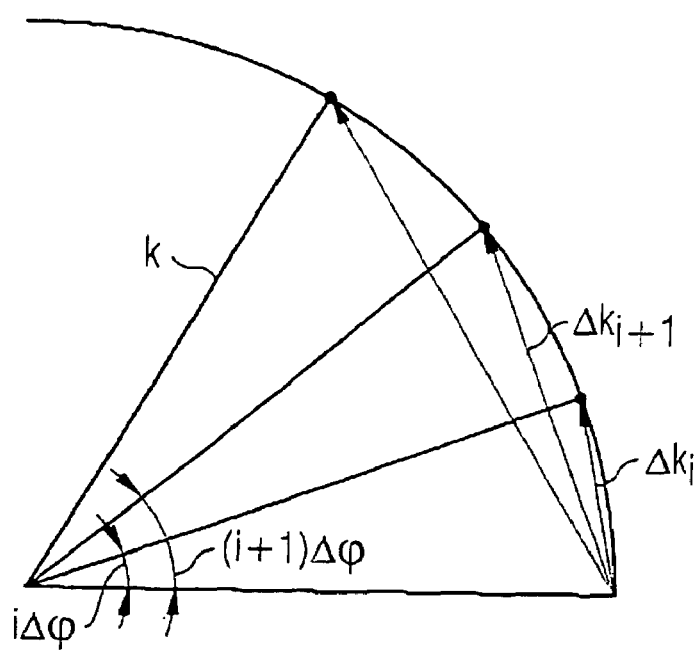
FIG. 3 illustrates shifting of a point in the frequency domain.

FIG. 1 is a schematic illustration of a magnetic resonance imaging apparatus for producing a magnetic resonance image of a subject according to the present invention; The components of the tomography apparatus correspond to those of a tomography apparatus, with the exceptions discussed below. A basic field magnet 1 produces a strong magnetic field that is constant over time for the polarization or alignment of the nuclear spins in the region under examination of a subject, for example a part to be examined of a human body. The high degree of homogeneity of the basic magnetic field required for the magnetic resonance scan is defined in a spherical measurement volume MV, into which the parts of the human body that are to be examined are brought. In order to satisfy the homogeneity requirements, and in particular to eliminate chronologically non-varying influences, shim plates made of a ferromagnetic material are attached at a suitable location. Chronologically varying influences are eliminated by shim coils 2, which are fed by a shim power supply 15.

A cylindrical gradient coil system 3 composed of three windings is disposed in basic field magnet 1. Each winding is supplied with power by an amplifier 14 in order to produce a linear gradient field in the respective direction of the Cartesian coordinate system. The first winding of gradient coil system 3 produces a gradient $G_x$ in the x direction, the second winding produces a gradient $G_y$ in the y direction, and the third winding produces a gradient $G_z$ in the z direction. Each amplifier has a digital-analog converter that is controlled by a sequence control unit 18 for the correctly timed production of gradient pulses.

Inside the gradient coil system 3 there is a radio-frequency antenna 4 that converts the radio-frequency pulses emitted by a radio-frequency power amplifier 16 into a magnetic alternating field for the excitation of the nuclei and the orientation of the nuclear spins of the subject to be examined, or of the region of the subject to be examined, The radio-frequency antenna 4 is composed of one or more RF transmission coils and a number of RF receive coils in the form of an annular, preferably linear or matrix-like, arrangement of component coils. The alternating field emanating from the precessing nuclear spins, generally spin echo signals resulting from a pulse sequence of one or more radio-frequency pulses and one or more gradient pulses, is converted by the RF reception coils of the radio-frequency antenna 4 into a voltage that is supplied to a radio-frequency reception channel 8 of a radio-frequency system 22 via an amplifier 7. The radio-frequency system 22 additionally has a transmission channel 9 in which the radio-frequency pulses for the excitation of the magnetic nuclear resonance are produced. Here, the respective radio-frequency pulses are represented in a sequence control unit 18 digitally as a sequence of complex numbers, based on a pulse sequence predetermined by system control computer 20, Via respective inputs 12, this sequence of numbers is supplied as a real part and an imaginary part to a digital-analog converter in the radio-frequency system 22, and from there to a transmission channel 9. In the transmission channel 9, the pulse sequences are modulated onto a radio-frequency carrier signal having a base frequency that corresponds to the resonance frequency of the nuclear spins in the measurement volume.

The changeover between transmission mode and reception mode takes place via a transmit/receive diplexer 6. The RF transmission coil of radio-frequency antenna 4 omits the radio-frequency pulses for the excitation of the nuclear spins into the measurement volume MV, and scans the resulting echo signals via the RF reception coils. The acquired magnetic resonance signals are demodulated in phase-sensitive fashion in the reception channel 8 of the radio frequency system 22, and are converted via respective analog-digital converters into the real part and the imaginary part of the measurement signal. Using an image computer 17, an image is reconstructed from the measurement data obtained in this way. The management of the measurement data, the image data, and the control programs takes place via the system control computer 20. On the basis of a specification with control programs, a sequence control unit 18 controls the production of the desired pulse sequences and the corresponding scanning of k-space. In particular, the sequence control unit 18 controls the correctly timed switching of the gradients, the emission of the radio-frequency pulses with a defined phase and amplitude, and the reception of the magnetic resonance signals. The time base for radio-frequency system 22 and sequence control unit 18 is provided by a synthesizer 19. The selection of control programs for producing a magnetic resonance image, as well as the representation of the produced spin image, takes place via a terminal (console) 21 that has a keyboard as well as one or more display screens.

The present invention involves a PPA method with radial scanning in which an artifact-free image reconstruction is possible without explicit measurement of the coil profiles. The method of additional projections (radial trajectories) are produced without calibration measurements, so the measurement time can be significantly shortened. The image acquisition is therefore accelerated by avoiding reference measurements for determining the coil sensitivities. This technique, as implanted for example in sequence control unit 18 of the magnetic resonance apparatus shown in FIG. 1, is based on the following procedure, shown schematically in FIGS. 4 and 5:

In step 1 an under-scanning of k-space takes place by measurement of a reduced projection data set. The reduced projection data set is composed of a number of projections $\phi$. The measurement takes place by a progressive rotation of the readout gradient at a fixed step angle $\Delta\Phi$. A projection-type scanning of k-space is accomplished using component coils that are arranged around the subject in linear or annular fashion in both directions of k-space, or (as shown in FIG. 7) that are arranged around the subject in the manner of a matrix. The step angle $\Delta\Phi$ is dimensioned such that the under-scanning of k-space occurs with the component coils. The result yields an arrangement of the k-space data, as represented by the solid lines in the shape of a star in FIG. 6. Under-scanning of a data set means that with an individual reception channel (or component coil) not enough data are acquired to permit the reconstruction therefrom of an artifact-free image in the spatial domain. Depending on the quantity of k-space data that are omitted, an under-scanning yields a significant reduction of the measurement time.

In the next steps, on the basis of the measured under-scanned projection data set, using the information contained in the M receive channels (component coils) additional projections are obtained purely computationally that form additional (preferably equidistant, i.e., rotated by a uniform angle $\Delta\phi$) trajectories between the measured projections $\phi$, and that complete the under-scanned projection data set, so that an artifact-free image reconstruction in the spatial domain is enabled.

Figure 4:
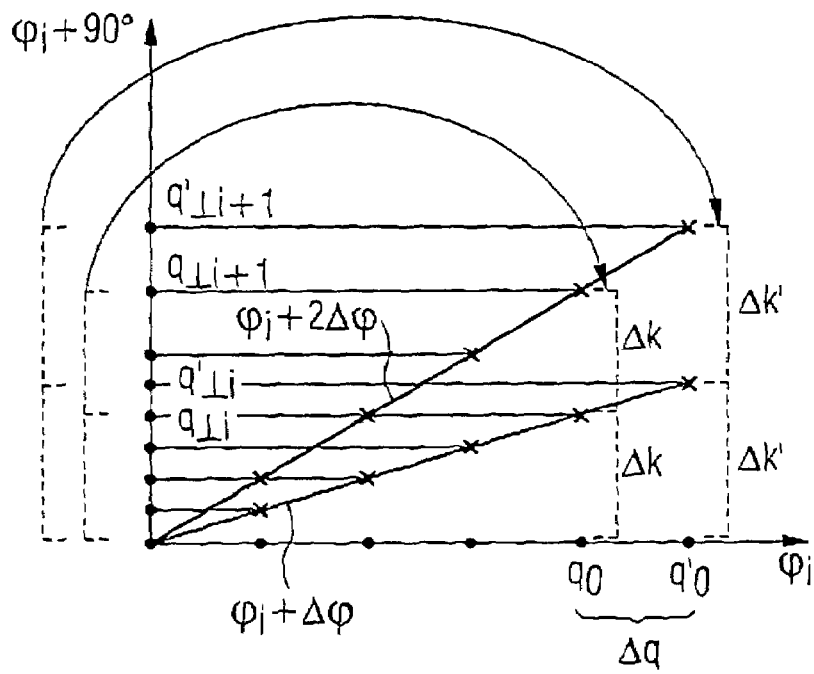
FIG. 4 shows the determination of two additional radial trajectories on the basis of measurement points of two trajectories that and perpendicular to one another.
Figure 5:
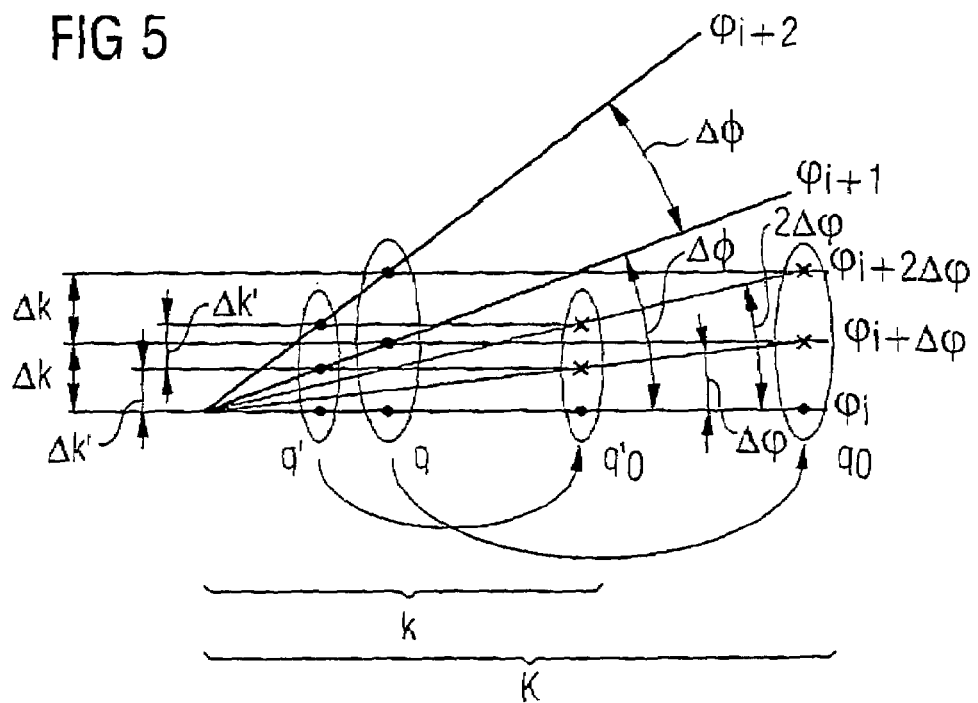
FIG. 5 shows the determination of two additional radial trajectories on the basis of measurement points of three adjacent trajectories.
Figure 6:
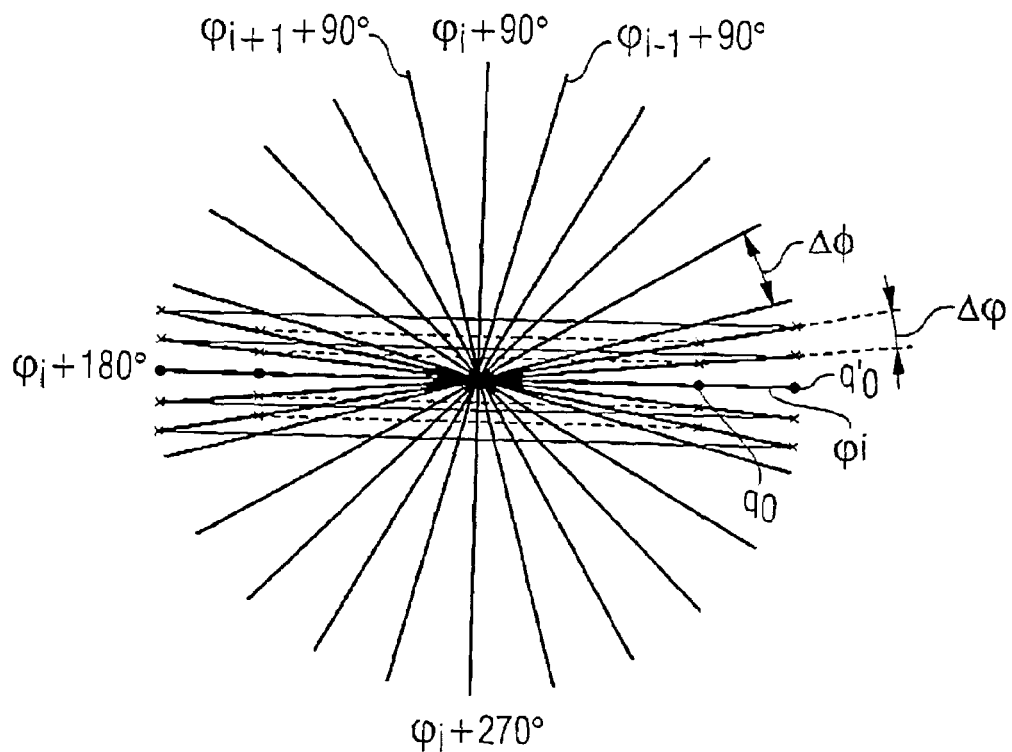
FIG. 6 is an overview image of the reconstruction method according to the present invention on the basis of a PPA measurement with 12 acquired radial trajectories.
Figure 7:
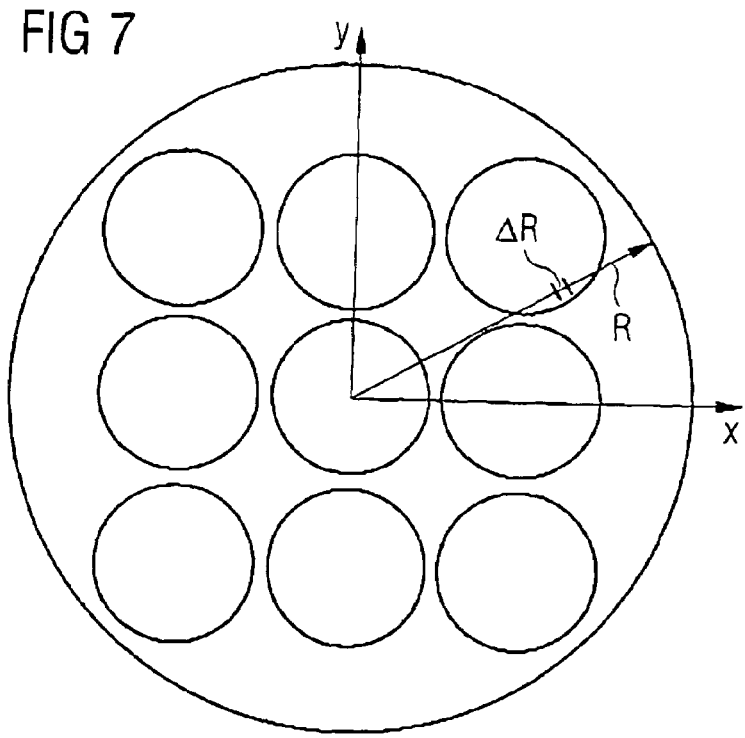
FIG. 7 shows a possible matrix-type arrangement of M=9 component coils.

For this purpose, as explained in FIGS. 4, 5, and 6, first a measured trajectory $\phi_i$ is considered, as well as an additional measured trajectory $\phi_i+\alpha_0$ that encompasses an angle $\alpha_0$ with this first trajectory. From measured values $G_0(q_{\perp n}, \phi_i+\alpha_0)$ of trajectory $\phi_i+\alpha_0$ rotated by $\alpha_0$, in a step 2 a "shift operator" is calculated algebraically in the form of a coefficient matrix $C(\Delta k)$, which in a step 3 is subsequently applied to individual points $q_0, q_0', \ldots$ of trajectory $\phi_i$ with $\Delta\phi$ or $2\Delta\phi$, etc., held constant, so that a set of points arises that forms additional trajectories that are rotated by $\Delta\phi$ or $2\Delta\phi$, etc., relative to $\phi_i$. FIG. 4 shows the special case for $\alpha_0$–90°, in which the shift operators $C(\Delta k)$ are calculated only from measured values on the trajectory $\phi_i+90°$, which is orthogonal, i.e. perpendicular, to trajectory $\phi_i$.

In a step 4, this procedure is applied to all measured trajectories $\phi_i$, $\phi_{i+1}$, $\phi_{i+2}$, etc., of the under-scanned projection data set, forming a value set $\overline{G}(k,\phi,\Delta k=q_0 tg\Delta\phi)$ or $\overline{G}(k,\phi,\Delta k=q_0 tg\Delta 2\phi)$, etc., of k-space that no longer has to be measured explicitly, resulting in a reduction of measurement time with the same image quality of the image reconstructed in the spatial domain. In a final step 5, the reconstruction of the image in the spatial domain takes place on the basis of the projections completed purely computationally according to steps 1 through 4.

The algebra of the method according to the present invention is represented in more detail below on the basis of the special case $\alpha_0$=90°: a group of parallels having distance $\Delta k_n$=n$\Delta k$ from trajectory $\phi_i$ (in the following also designated scanning (sampling) radius k with angle $\phi_i$) is produced in k-space. The radius k corresponds to the distance of a point q on trajectory $\phi_i$ from the origin. In this way, the outermost point of the trajectory defines the largest scanning radius K. The point of intersection of the parallels with circle K thus defines the end points of new scanning radii with angle $\phi_i+\Delta\phi_n$. The magnetizations on the parallels are in turn produced by linear combination of the individual coil signals. The coefficients, which are unknown at first, result from already-measured magnetic resonance signals at the intersection points of the parallels with scanning radius $k_\perp$, or trajectory $\phi_i+90°$, rotated by 90° to scanning radius k or to trajectory $\phi_i$. At these intersection points, equations can be established for the unknown coefficients of the linear combination of the individual coil signals for the parallel shifting $\Delta k_n$. In a corresponding manner, the other points k<K are also generated on the newly generated scanning radii, with angle $\phi_i+\Delta\phi_n$. This method is carried out for all angles or trajectories $\phi_i$, so that the overall k-space is occupied more densely with scanning radii or trajectories than were measured directly Given linear independence of the coil signals, with $$\overline{F}(k,\varphi) = \begin{pmatrix} F_1(k,\varphi) \\ \ldots \\ F_M(k,\varphi) \end{pmatrix} \quad (6)$$

as the vector of the coil signals at the point k,$\phi$ in the k-space, and $$\overline{G}(k,\varphi,\Delta k) = \begin{pmatrix} G_0(k,\varphi) \\ \ldots \\ G_n(k,\varphi+\arcsin(n\Delta k/K)) \\ \ldots \\ G_{M-1}(k,\varphi+\arcsin((M-1)\Delta k/K)) \end{pmatrix} \quad (7)$$

as the vector of the magnetization in the k-space at the points k, $\phi$+arcsin n ($\Delta$k/K), as well as $$C(\Delta k) = \begin{pmatrix} C_{1,l}(\Delta k) & \ldots & C_{1,M}(\Delta k) \\ \ldots & C_{nm}(\Delta k) & \ldots \\ C_{M-1,l}(\Delta k) & \ldots & C_{M-1,M}(\Delta k) \end{pmatrix} \quad (8)$$

as the coefficient matrix or "shift operator" (where $\Delta k_n = n\Delta k$), it follows that through M linear combinations of the coil signals, M−1 new, linearly independent magnetic resonance signals can be produced in the k-space (SMASH technique):

$$\overline{G}(k,\phi,\Delta k) = C(\Delta k)\overline{F}(k,\phi) \quad (9a)$$

Instead of producing the sum of the individual coil signals at a point in the k-space using the individual coil signals at other points in the k-space, it is equally possible, analogous to the GRAPPA method (Magnetic Resonance in Medicine 47, 1202-1210 (2002)), to fit the individual coil signals at a point in the k-space with the individual coil signals at other points in k-space, and then to reconstruct an extra image for each coil. The overall image then arises through weighted superposition of the individual images, e.g. by quadratic superposition. In this case, equation (9a) is modified to the extent that the vector $\overline{G}(k,\phi,\Delta k)$ of shifted combined measured coil signals is replaced by a vector $\overline{F}(k,\phi,\Delta k)$ of shifted measured coil signals:

$$\Delta \overline{F}(k,\phi,\Delta k) = C(\Delta k)\overline{F}(k,\phi) \quad (9b)$$

As shown in FIGS. 4 and 6, the magnetizations $\overline{G}(k,\phi,\Delta k)$ according to equation (9a), or the coil signals $\overline{F}(k,\phi,\Delta k)$ according to equation (9b), lie on parallels that are shifted by (M−1)$\Delta k$ to the measurement radius k,$\phi_i$, and intersect the measurement radius or the orthogonals k,$\phi_i$+90° at points $q_{\perp l n}$.

From the known (because measured) magnetizations $$G_0(q_{\perp n}, \varphi + 90°) = \sum_{m=1}^{M} F_m(q_{\perp n}, \varphi + 90°) \quad (2b)$$

at these points of intersection, the coefficient matrix C($\Delta k$) can be determined by back-calculation using the pseudo-inverses $F'(FF')^{-1}$, where F' represents the square matrix, i.e., the complex conjugate transposed matrix:

$$G_0(q_{\perp n},\phi+90°,\Delta k) = C(\Delta k)\overline{F}(q=0,\phi+90°)$$

$$\overline{GF'} = C(\overline{FF'})$$

$$\overline{GF'}(\overline{FF'})^{-1} = C \quad (10a)$$

and where, in the case of a reconstruction using GRAPPA, $\overline{G}(q_\perp,\phi+90°,\Delta k)$ is to be replaced by $\Delta \overline{F}(q_\perp,\phi+90°, \Delta k)$.

In order to increase the precision of the coefficient matrix C($\Delta k$), additional known magnetizations, shifted relative to one another by $\Delta k$, $$\overline{G}(q_\perp,\phi+90°,(b-1)\cdot\Delta k) = C(\Delta k)\overline{F}(q=0,\phi+90°,b\cdot\Delta k) \quad (10b)$$

can be taken into account, where, in the case of a reconstruction using GRAPPA, $\overline{G}(q_\perp,\phi+90°,(b-1)\cdot\Delta k)$ is to be replaced by $\Delta\overline{F}(q_\perp, \phi+90°,(b-1)\cdot\Delta k)$, and where b is advantageously to be chosen such that $|b\cdot\Delta k| \leq K$.

Due to $$\Delta\varphi_n = \arcsin\frac{n\Delta k}{K},$$

from the coefficient matrices C determined at points $q_{\perp i}$, $\phi_i$+90° in the k-space, new magnetizations can be produced along a radius k, $\phi$+n$\Delta\phi$ from the magnetizations measured at points $q_0$, $\phi_i$, by modifying successive $\Delta k = q_0 tg\Delta\phi$, with $\Delta\phi$ held constant (see FIG. 4)

$$\overline{G}(k,\phi,\Delta k=q_0 tg\Delta\phi) = C(\Delta k)\overline{F}(q_0,\phi) \quad (11)$$

where, again, in the case of a reconstruction using GRAPPA, $\overline{G}(k,\phi,\Delta k=q_0 tg\Delta\phi)$ is to be replaced by $\Delta\overline{F}(k,\phi,\Delta k=q_0 tg\Delta\phi)$.

These scanning radii or trajectories therefore no longer need be measured explicitly. The precondition is only that a smaller scanning interval $\Delta q$ be selected along scanning radii k than is required by the scanning theorem, so that sufficient measurement points will be present for the additionally produced scanning radii. For this purpose, measurement signals having a higher bandwidth are to be scanned, but which however does not require an increase in the measurement time.

The inventive method can be expanded to negative increments −$\Delta k$ by taking into account the corresponding intersection points having radius k, $\phi$−90°.

Because sin $\Delta\phi$~tg$\Delta\phi$~$\Delta\phi$ holds for small intermediate angles (see also the approximation through equation (4b) for n$\Delta\phi$<<1), the intersection points of parallels shifted by $\Delta k$ to scanning radius k with the scanning radii of angle $\phi_{i\pm a}\pm\alpha_0$ can additionally be used to determine shift operator C, thus increasing the precision of this determination. FIG. 6 shows such a scattering about a=±1 for $\alpha_0$=90°, in which the trajectories $\phi_{i\pm1}\pm 90°$ are additionally taken into account.

FIG. 7 shows, as an exemplary embodiment, an array of M=9 imaging coils. Of the M coils, it is always the case that only the ones situated as perpendicularly as possible to the scanning radius are active, Thus, for the generation of new scanning radii not all M coils will always be used; rather, a subset (e.g. 2 to 4), situated on axes perpendicular to the respective k direction, will be used, so that during the determination of the coefficients determinants that are too small will not occur, which would result in an instability of the solution of the equation system. In this way, the computing burden is also kept low due to the smallness of the matrices, and can be carried out rapidly for the new points to be generated.

If the coils are situated along only one direction (as is preferable), it makes sense to select the angular steps that are to be measured only perpendicular thereto to be large, and to generate new angular intermediate steps, while in the direction parallel to the coil direction small angular steps are selected for the gradients.

A completion of the under-scanned projection data set also can be achieved by shifting this set along all trajectories $\phi_i$ by ±n$\Delta k$, on the basis of the determined shift operators. However, the data set, that in this way has likewise been completed purely computationally, causes a relatively non-uniform k-space occupation, resulting in a more expensive image reconstruction, unless a skillful shifting is carried out in such a way that all the points again come to be situated on radial lines in k-space.

For image reconstruction from the entries in k-space (also called raw data), two methods are standard:

1. Filtered back-projection. This uses Fourier transformation to produce projections from the data falling on a scanning radius, filters these projections, and projects them into the spatial domain. This method is very commonly used in x-ray computed tomography. For magnetic resonance tomography, this type of reconstruction is advantageous to the extent that the magnitude of the projection can be back-projected, whereby the method becomes very insensitive to phase fluctuations over the image field. It is also not absolutely necessary that the raw data occur along equidistant angular steps, which can be advantageous in the above-described production of new raw data.

2. Regridding. This method interpolates and projects raw data of the k-space onto a Cartesian grid, from which the magnetic resonance image then follows through a two-dimensional Fourier transformation. This method can easily be combined with parallel data acquisition in order to reduce the measurement time or to enlarge the image field.

Although modifications and changes may be suggested by those skilled in the art, it is the intention of the inventors to embody within the patent warranted hereon all changes and modifications as reasonably and properly come within the scope of their contribution to the art.

We claim as our invention:

1. A method for PPA magnetic resonance tomography imaging with radial data acquisition, comprising the steps of:
   (1) under-scanning k-space by acquiring a plurality of projections $\phi$ of magnetic resonance data with a coil array of M component coils;
   (2) determining a shift operator $C(\pm n\Delta k)$ for a projection $\phi_i$ dependent on acquired magnetizations along a projection $\phi_i \pm \alpha_0$ that encompasses $\phi_i$ and an angle $\alpha_0$, with n=1, 2, ..., m−1 by solving over-determined equation systems of $\overline{G}$, $\overline{F}$ and C, or $\Delta \overline{F}$, $\overline{F}$ and C, with the pseudo-inverses $\overline{F}'(\overline{FF}')^{-1}$, where $\overline{G}$ represents in each case the vector of shifted combined measured coil signals, $\overline{F}$ represents in each case the vector of measured coil signals, and $\Delta \overline{F}$ represents a vector of shifted measured coil signals;
   (3) applying said shift operator $C(\pm n\Delta k)$ to individual points of the projection $\phi_i$ to obtain calculated projection points, thereby purely computationally completing the projection $\phi_i$;
   (4) repeating steps (2) and (3) for all projections $\phi$; and
   (5) reconstructing an image in the spatial domain from said purely computationally completed projection $\phi$.

2. A method as claimed in claim 1 comprising employing $\alpha_0 = 90°$.

3. A method as claimed in claim 1 comprising employing a coil array comprising a linear arrangement of coils having a longitudinal direction and an orthogonal direction perpendicular to said longitudinal direction, with an angular scanning density in said longitudinal direction being larger than in said orthogonal direction.

4. A method for PPA magnetic resonance tomography imaging with radial data acquisition, comprising the steps of:
   (1) under-scanning k-space by acquiring a plurality of projections $\phi$ of magnetic resonance data with a coil array of M component coils;
   (2) determining respective shift operators $C(\pm n\Delta k)$ for projections $\phi_i \pm a$ along and adjacent to a projection $\phi_i \pm \alpha_0$, wherein a=1, 2, ... depending on a degree of precision for determining $C(\pm n\Delta k)$, and wherein $\phi_i \pm \alpha_0$ encompasses $\phi_i$ and an angle $\alpha_0$, with n=1, 2, ..., m−1;
   (3) applying said shift operator $C(\pm n\Delta k)$ to individual points of the protection $\phi_i$ to obtain calculated protection points, thereby purely computationally completing the protection $\phi_i$;
   (4) repeating steps (2) and (3) for all projections $\phi$; and
   (5) reconstructing an image in the spatial domain from said purely computationally completed protection $\phi$.

5. A method as claimed in claim 4 comprising employing $\alpha_0 = 90°$.

6. A method as claimed in claim 4 comprising employing a coil array comprising a linear arrangement of coils having a longitudinal direction and an orthogonal direction perpendicular to said longitudinal direction, with an angular scanning density in said longitudinal direction being larger than in said orthogonal direction.

7. A method for PPA magnetic resonance tomography imaging with radial data acquisition, comprising the steps of:
   (1) under-scanning k-space by acquiring a plurality of projections $\phi$ of magnetic resonance data with a coil array of M component coils;
   (2) determining a shift operator $C(\pm n\Delta k)$ for a projection $\phi_i$ dependent on acquired magnetizations along a projection $\phi_i \pm \alpha_0$ that encompasses $\phi_i$ and an angle $\alpha_0$, with n=1, 2, ..., m−1 by solving over-determined equation systems of $\overline{G}$, $\overline{F}$ and C, or $\Delta \overline{F}$, $\overline{F}$ and C, with the pseudo-inverses $\overline{F}'(\overline{FF}')^{-1}$, where $\overline{G}$ represents in each case the vector of shifted combined measured coil signals, $\overline{F}$ represents in each case the vector of measured coil signals, and $\Delta \overline{F}$ represents a vector of shifted measured coil signals;
   (3) applying said shift operator $C(\pm n\Delta k)$ to individual points of the projection $\phi_i$ to obtain calculated projection points, thereby purely computationally completing the projection $\phi_i$;
   (4) repeating steps (2) and (3) for all projections $\phi$; and obtaining a complete raw data set in k-space by calculating projections shifted in different directions by $\pm n\Delta k$, dependent on the respectively determined shift operators $C(\pm n\Delta k)$ and the measured projections $\phi$; and
   (5) reconstructing an image in the spatial domain from said purely computationally completed protection $\phi$.

8. A method as claimed in claim 7 comprising employing said projections shifted in different directions for reconstructing said image in the spatial domain in step (5).

9. A method as claimed in claim 7 comprising employing only portions of the projections shifted in different directions that lie on radial lines in k-space for reconstructing said image in the spatial domain in step (5).

10. A method as claimed in claim 7 comprising employing $\alpha_0 = 90°$.

11. A method as claimed in claim 7 comprising employing a coil array comprising a linear arrangement of coils having a longitudinal direction and an orthogonal direction perpendicular to said longitudinal direction, with an angular scanning density in said longitudinal direction being larger than in said orthogonal direction.

12. A magnetic resonance tomography apparatus comprising:
    a magnetic resonance scanner configured to interact with a subject therein to acquire magnetic resonance data from the subject, said magnetic resonance scanner having a coil array of M component coils;

a control unit for operating said magnetic resonance scanner to under-scan k-space by acquiring a plurality of projections φ of said magnetic resonance data with said coil array; and said control unit determining a shift operator C(±nΔk) for a projection $\phi_i$ dependent on acquired magnetizations along a projection $\phi_i \pm \alpha_0$ that encompasses $\phi_i$ and an angle $\alpha_0$, with n=1, 2, ..., m−1, by solving over-determined equation systems of $\overline{G}, F$ and C, or $\Delta F, F$ and C, with the pseudo-inverses $F'(FF')^{-1}$, where $\overline{G}$ represents in each case the vector of shifted combined measured coil signals, F represents in each case the vector of measured coil signals, and $\Delta F$ represents a vector of shifted measured coil signals, and applying said shift operator C(±nΔk) to individual points of the projection $\phi_i$ to obtain calculated projection points, thereby purely computationally completing the projection $\phi_i$, and repeating the determination and application of said shift operator C(±nΔk) for all projections φ; and an image computer for reconstructing an image in the spatial domain from said purely computationally completed projection φ.

13. A magnetic resonance tomography apparatus as claimed in claim 12 wherein said coil array comprises a linear arrangement of said M coils having a longitudinal direction and an orthogonal direction perpendicular to said longitudinal direction, with an angular scanning density in said longitudinal direction being larger than in said orthogonal direction.

14. A data structure, being loadable into a sequence controller and into a computer of a magnetic resonance tomography apparatus having a magnetic resonance scanner with a coil array of M component coils, and said data structure causing:

said sequence controller to operate said scanner to under-scan k-space by acquiring a plurality of projections φ of magnetic resonance data with said coil array; and said computer to determine a shift operator C(±nΔk) for a projection $\phi_i$ dependent on acquired magnetizations along a projection $\phi_i \pm \alpha_0$ that encompasses $\phi_i$ and an angle $\alpha_0$, with n=1, 2, ..., m−1, by solving over-determined equation systems of $\overline{G}, F$ and C, or $\Delta F, F$ and C, with the pseudo-inverses $F'(FF')^{-1}$, where G represents in each case the vector of shifted combined measured coil signals, F represents in each case the vector of measured coil signals, and $\Delta F$ represents a vector of shifted measured coil signals, to apply said shift operator C(±nΔk) to individual points of the projection $\phi_i$ to obtain calculated projection points, thereby purely computationally completing the projection $\phi_i$, to repeat steps the determination and application of said shift operator C(±nΔk) for all projections φ, and to reconstruct an image in the spatial domain from said purely computationally completed projection φ.

15. A magnetic resonance tomography apparatus comprising:

a magnetic resonance scanner configured to interact with a subject therein to acquire magnetic resonance data from the subject, said magnetic resonance scanner having a coil array of M component coils;

a control unit for operating said magnetic resonance scanner to under-scan k-space by acquiring a plurality of projections φ of said magnetic resonance data with said coil array; and said control unit determining respective shift operators C(±nΔk) for projections $\phi_i \pm a$ along an adjacent to a projection $\phi_i \pm \alpha_0$, wherein a=1, 2, ... depending on a degree of precision for determining C(±nΔk), and wherein $\phi_i \pm \alpha_0$ encompasses $\phi_i$ and angle $\alpha_0$, with n=1, 2, ..., m−1, and applying said shift operator C(±nΔk) to individual points of the projection $\phi_i$ to obtain calculated projection points, thereby purely computationally completing the projection $\phi_i$, and repeating the determination and application of said shift operator C(±nΔk) for all projections φ; and an image computer for reconstructing an image in the spatial domain from said purely computationally completed projection φ.

16. A magnetic resonance tomography apparatus as claimed in claim 15 wherein said coil array comprises a linear arrangement of said M coils having a longitudinal direction and an orthogonal direction perpendicular to said longitudinal direction, with an angular scanning density in said longitudinal direction being larger than in said orthogonal direction.

17. A magnetic resonance scanner configured to interact with a subject therein to acquire magnetic resonance data from the subject, said magnetic resonance scanner having a coil array of M component coils;

a control unit for operating said magnetic resonance scanner to under-scan k-space by acquiring a plurality of projections φ of said magnetic resonance data with said coil array; and said control unit determining a shift operator C(±nΔk) for a projection $\phi_i$ obtaining a complete raw data set in k-space by calculating projections shifted in different directions by ±nΔk, dependent on the respectively determined shift operators C(±nΔk) and the measured projections φ; and an image computer for reconstructing an image in the spatial domain from said purely computationally completed projection φ.

18. A magnetic resonance tomography apparatus as claimed in claim 17 wherein said reconstruction computer employs said projections shifted in different directions for reconstructing said image in the spatial domain.

19. A magnetic resonance apparatus as claimed in claim 17 wherein said image reconstruction computer employs only portions of the projections shifted in different directions that lie on radial lines in k-space for reconstructing said image in the spatial domain.

20. A magnetic resonance tomography apparatus as claimed in claim 17 wherein said coil array comprises a linear arrangement of said M coils having a longitudinal direction and an orthogonal direction perpendicular to said longitudinal direction, with an angular scanning density in said longitudinal direction being larger than in said orthogonal direction.

21. A computer software product stored on a data storage medium as readable program code, said data storage medium being loadable into a sequence controller and into a computer of a magnetic resonance tomography apparatus having a magnetic resonance scanner with a coil array of M component coils, said computer software product causing:

said sequence controller to operate said scanner to under-scan k-space by acquiring a plurality of projections φ of magnetic resonance data with said coil array; and said computer to determine respective shift operators C(±nΔk) for projections $\phi_i \pm a$ along an adjacent to a projection $\phi_i \pm \alpha_0$, wherein a=1, 2, ... depending on a degree of precision for determining C(±nΔk), and wherein $\phi_i \pm \alpha_0$ encompasses $\phi_i$ and angle $\alpha_0$, with n=1, 2, ..., m−1, to apply said shift operator C(±nΔk) to individual points of the projection $\phi_i$ to obtain calculated projection points, thereby purely computationally completing the projection $\phi_i$, to repeat steps the determination and application of said shift operator $C(\pm n\Delta k)$ for all projections $\phi_i$, and to reconstruct an image in the spatial domain from said purely computationally completed projection $\phi$.

22. A computer software product stored on a data storage medium as readable program code, said data storage medium being loadable into a sequence controller and into a computer of a magnetic resonance tomography apparatus having a magnetic resonance scanner with a coil array of M component coils, said computer software product causing:

said sequence controller to operate said scanner to underscan k-space by acquiring a plurality of projections $\phi$ of magnetic resonance data with said coil array; and said computer to determine a shift operator $C(\pm n\Delta k)$ for a projection $\phi_i$ dependent on acquired magnetizations along a projection $\phi_i \pm \alpha_0$ that encompasses $\phi_i$ and an angle $\alpha_0$, with n=1,2, ... , m−1, to apply said shift operator $C(\pm n\Delta k)$ to individual points of the projection $\phi_i$ to obtain calculated projection points, thereby purely computationally completing the projection $\phi_i$, to repeat steps the determination and application of said shift operator $C(\pm n\Delta k)$ for all projections $\phi$, to obtain a complete raw data set in k-space by calculating projections shifted in different directions by $\pm n\Delta k$, dependent on the respectively determined shift operators $C(\pm n\Delta k)$ and the measured projections $\phi$ and to reconstruct an image in the spatial domain from said purely computationally completed projection $\phi$.

23. A computer readable medium as claimed in claim 22 wherein said data structure causes said control unit to employ said projections shifted in different directions for reconstructing said image in the spatial domain.

24. A computer readable medium as claimed in claim 22 wherein said data structure causes said control unit to employ only portions of the projections shifted in different directions that lie on radial lines in k-space for reconstructing said image in the spatial domain.

* * * * *